(12) United States Patent
Chuang et al.

(10) Patent No.: US 11,114,491 B2
(45) Date of Patent: Sep. 7, 2021

(54) BACK-ILLUMINATED SENSOR AND A METHOD OF MANUFACTURING A SENSOR

(71) Applicant: KLA Corporation, Milpitas, CA (US)

(72) Inventors: Yung-Ho Alex Chuang, Cupertino, CA (US); Jehn-Huar Chern, Morgan Hill, CA (US); John Fielden, Los Altos, CA (US); Jingjing Zhang, San Jose, CA (US); David L. Brown, Los Gatos, CA (US); Sisir Yalamanchili, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 43 days.

(21) Appl. No.: 16/562,396

(22) Filed: Sep. 5, 2019

(65) Prior Publication Data

US 2020/0194476 A1 Jun. 18, 2020

Related U.S. Application Data

(60) Provisional application No. 62/778,445, filed on Dec. 12, 2018.

(51) Int. Cl.
*H01L 27/146* (2006.01)
*H01L 27/148* (2006.01)

(52) U.S. Cl.
CPC ...... *H01L 27/1464* (2013.01); *H01L 27/1462* (2013.01); *H01L 27/14685* (2013.01); *H01L 27/14806* (2013.01)

(58) Field of Classification Search
CPC ................................................ H01L 27/14683
See application file for complete search history.

(56) References Cited

U.S. PATENT DOCUMENTS 3,755,704 A 8/1973 Spindt et al.
3,870,917 A 3/1975 Cuny
(Continued)

FOREIGN PATENT DOCUMENTS

EP 0602983 A1 6/1994
EP 0746871 A1 12/1996
(Continued)

OTHER PUBLICATIONS

U.S. Appl. No. 61/720,700—Certified Copy corres to PCT/EP2013/071080, pp. 1-44.
(Continued)

*Primary Examiner* — Christopher A Johnson
(74) *Attorney, Agent, or Firm* — Bever, Hoffman & Harms, LLP

(57) ABSTRACT

An image sensor utilizes a pure boron layer and a second epitaxial layer having a p-type dopant concentration gradient to enhance sensing DUV, VUV or EUV radiation. Sensing (circuit) elements and associated metal interconnects are fabricated on an upper surface of a first epitaxial layer, then the second epitaxial layer is formed on a lower surface of the first epitaxial layer, and then a pure boron layer is formed on the second epitaxial layer. The p-type dopant concentration gradient is generated by systematically increasing a concentration of p-type dopant in the gas used during deposition/growth of the second epitaxial layer such that a lowest p-type dopant concentration of the second epitaxial layer occurs immediately adjacent to the interface with the first epitaxial layer, and such that a highest p-type dopant concentration of the second epitaxial layer occurs immediately adjacent to the interface with pure boron layer.

16 Claims, 6 Drawing Sheets

(56) References Cited

U.S. PATENT DOCUMENTS

| | | |
|---|---|---|
| 3,947,707 A | 3/1976 | Shannon et al. |
| 4,099,198 A | 7/1978 | Howorth et al. |
| 4,210,922 A | 7/1980 | Shannon |
| 4,275,326 A | 6/1981 | Houtkamp |
| 4,348,690 A | 9/1982 | Jastrzebski et al. |
| 4,467,189 A | 8/1984 | Tsuchiya |
| 4,555,731 A | 11/1985 | Zinchuk |
| 4,644,221 A | 2/1987 | Gutierrez et al. |
| 4,760,031 A | 7/1988 | Janesick |
| 4,853,595 A | 8/1989 | Alfano et al. |
| 5,054,683 A | 10/1991 | Haisma et al. |
| 5,120,949 A | 6/1992 | Tomasetti |
| 5,144,630 A | 9/1992 | Lin |
| 5,227,313 A | 7/1993 | Gluck et al. |
| 5,272,096 A * | 12/1993 | de Fresart ........... H01L 29/1608 117/90 |
| 5,315,126 A | 5/1994 | Field |
| 5,376,810 A | 12/1994 | Hoenk et al. |
| 5,428,392 A | 6/1995 | Castro et al. |
| 5,563,702 A | 10/1996 | Emery et al. |
| 5,717,518 A | 2/1998 | Shafer et al. |
| 5,719,069 A | 2/1998 | Sparks |
| 5,731,584 A | 3/1998 | Beyne et al. |
| 5,742,626 A | 4/1998 | Mead et al. |
| 5,760,809 A | 6/1998 | Malhotra et al. |
| 5,760,899 A | 6/1998 | Eismann |
| 5,852,322 A | 12/1998 | Speckbacher |
| 5,940,685 A | 8/1999 | Loomis et al. |
| 5,999,310 A | 12/1999 | Shafer et al. |
| 6,013,399 A | 1/2000 | Nguyen |
| 6,030,852 A | 2/2000 | Sano et al. |
| 6,064,759 A | 5/2000 | Buckley et al. |
| 6,162,707 A | 12/2000 | Dinh et al. |
| 6,201,257 B1 | 3/2001 | Stettner et al. |
| 6,201,601 B1 | 3/2001 | Vaez-Iravani et al. |
| 6,220,914 B1 | 4/2001 | Lee et al. |
| 6,271,916 B1 | 8/2001 | Marxer et al. |
| 6,278,119 B1 | 8/2001 | Nikzad et al. |
| 6,285,018 B1 | 9/2001 | Aebi et al. |
| 6,297,879 B1 | 10/2001 | Yang et al. |
| 6,307,586 B1 | 10/2001 | Costello |
| 6,346,700 B1 | 2/2002 | Cunningham et al. |
| 6,362,484 B1 | 3/2002 | Beyne et al. |
| 6,373,869 B1 | 4/2002 | Jacob |
| 6,403,963 B1 | 6/2002 | Nikzad et al. |
| 6,535,531 B1 | 3/2003 | Smith et al. |
| 6,545,281 B1 | 4/2003 | McGregor et al. |
| 6,608,676 B1 | 8/2003 | Zhao et al. |
| 6,711,283 B1 | 3/2004 | Soenksen |
| 6,837,766 B2 | 1/2005 | Costello |
| 7,005,637 B2 | 2/2006 | Costello et al. |
| 7,039,157 B2 | 5/2006 | Fujii et al. |
| 7,126,699 B1 | 10/2006 | Wihl et al. |
| 7,130,039 B2 | 10/2006 | Vaez-Iravani et al. |
| 7,136,159 B2 | 11/2006 | Tsai et al. |
| 7,141,791 B2 | 11/2006 | Masnaghetti et al. |
| 7,238,583 B2 | 7/2007 | Swain et al. |
| 7,283,166 B1 | 10/2007 | Billman |
| 7,313,155 B1 | 12/2007 | Mu et al. |
| 7,321,468 B2 | 1/2008 | Herkommer et al. |
| 7,345,825 B2 | 3/2008 | Chuang et al. |
| 7,352,457 B2 | 4/2008 | Kvamme et al. |
| 7,432,517 B2 | 10/2008 | Botma et al. |
| 7,446,474 B2 | 11/2008 | Maldonado et al. |
| 7,465,935 B2 | 12/2008 | Urano et al. |
| 7,471,315 B2 | 12/2008 | Silsby et al. |
| 7,525,649 B1 | 4/2009 | Leong et al. |
| 7,528,943 B2 | 5/2009 | Brown et al. |
| 7,586,108 B2 | 9/2009 | Nihtianov et al. |
| 7,609,303 B1 | 10/2009 | Lee et al. |
| 7,609,309 B2 | 10/2009 | Brown et al. |
| 7,714,287 B1 | 5/2010 | James et al. |
| 7,741,666 B2 | 6/2010 | Nozaki et al. |
| 7,750,280 B2 | 7/2010 | Hwang et al. |
| 7,791,170 B2 | 9/2010 | Chiang et al. |
| 7,800,040 B2 | 9/2010 | Blacksberg et al. |
| 7,813,406 B1 | 10/2010 | Nguyen et al. |
| 7,838,833 B1 | 11/2010 | Lent et al. |
| 7,875,948 B2 | 1/2011 | Hynecek et al. |
| 7,928,382 B2 | 4/2011 | Hatakeyama et al. |
| 7,952,633 B2 | 5/2011 | Brown et al. |
| 7,985,658 B2 | 7/2011 | Lei et al. |
| 7,999,342 B2 | 8/2011 | Hsu et al. |
| 8,017,427 B2 | 9/2011 | Manabe |
| 8,138,485 B2 | 3/2012 | Nihtianov et al. |
| 8,309,443 B2 | 11/2012 | Tanaka et al. |
| 8,323,406 B2 | 12/2012 | Bondokov et al. |
| 8,450,820 B2 | 5/2013 | Nanver et al. |
| 8,455,971 B2 | 6/2013 | Chen et al. |
| 8,513,587 B2 | 8/2013 | Wang et al. |
| 8,514,587 B2 | 8/2013 | Zhang et al. |
| 8,629,384 B1 | 1/2014 | Biellak et al. |
| 8,680,637 B2 | 3/2014 | Hoenk et al. |
| 8,686,331 B2 | 4/2014 | Armstrong |
| 8,755,417 B1 | 6/2014 | Dribinski |
| 8,803,075 B2 | 8/2014 | Menge et al. |
| 8,828,852 B2 | 9/2014 | Hoenk et al. |
| 8,873,596 B2 | 10/2014 | Dribinski et al. |
| 8,891,079 B2 | 11/2014 | Zhao et al. |
| 8,929,406 B2 | 1/2015 | Chuang et al. |
| 9,024,344 B2 | 5/2015 | Hoenk |
| 9,123,622 B2 | 9/2015 | Hoenk et al. |
| 9,165,971 B2 | 10/2015 | Greer et al. |
| 9,305,949 B2 | 4/2016 | Chen et al. |
| 9,411,244 B2 | 8/2016 | Ryzhikov et al. |
| 9,426,400 B2 | 8/2016 | Brown et al. |
| 9,478,402 B2 | 10/2016 | Chuang et al. |
| 9,496,425 B2 | 11/2016 | Chern et al. |
| 9,529,182 B2 | 12/2016 | Chuang et al. |
| 9,601,299 B2 | 3/2017 | Chuang et al. |
| 9,608,399 B2 | 3/2017 | Chuang et al. |
| 9,748,294 B2 | 8/2017 | Muramatsu et al. |
| 9,818,887 B2 | 11/2017 | Chern et al. |
| 10,115,663 B2 | 10/2018 | Or-Bach et al. |
| 10,121,914 B2 | 11/2018 | Chern et al. |
| 10,197,501 B2 | 2/2019 | Chuang et al. |
| 2001/0017344 A1 | 8/2001 | Aebi |
| 2001/0024684 A1 | 9/2001 | Steiner et al. |
| 2002/0191834 A1 | 12/2002 | Fishbaine |
| 2003/0043876 A1 | 3/2003 | Lublin et al. |
| 2003/0111707 A1 | 6/2003 | Takaura et al. |
| 2003/0222579 A1 | 12/2003 | Habib et al. |
| 2004/0021061 A1 | 2/2004 | Bijkerk |
| 2004/0056279 A1 | 3/2004 | Niigaki et al. |
| 2004/0074261 A1 | 4/2004 | Caron et al. |
| 2004/0227070 A1 | 11/2004 | Bateman et al. |
| 2005/0122021 A1 | 6/2005 | Smith et al. |
| 2005/0167575 A1 | 8/2005 | Benz et al. |
| 2005/0190452 A1 | 9/2005 | Govorkov et al. |
| 2005/0196059 A1 | 9/2005 | Inoue et al. |
| 2005/0233493 A1 | 10/2005 | Augusto et al. |
| 2005/0255625 A1 | 11/2005 | Janesick et al. |
| 2005/0264148 A1 | 12/2005 | Maldonado et al. |
| 2005/0287479 A1 | 12/2005 | Moon et al. |
| 2006/0054778 A1 | 3/2006 | Suhling |
| 2006/0055321 A1 | 3/2006 | Maldonado et al. |
| 2006/0069460 A1 | 3/2006 | Smith et al. |
| 2006/0170324 A1 | 8/2006 | Machuca et al. |
| 2006/0188869 A1 | 8/2006 | Zeskind et al. |
| 2007/0002465 A1 | 1/2007 | Chuang et al. |
| 2007/0023770 A1 | 2/2007 | Miyajima et al. |
| 2007/0034987 A1 | 2/2007 | Costello et al. |
| 2007/0064135 A1 | 3/2007 | Brown et al. |
| 2007/0072326 A1 | 3/2007 | Zheng et al. |
| 2007/0096648 A1 | 5/2007 | Nakajima et al. |
| 2007/0103769 A1 | 5/2007 | Kuwabara |
| 2007/0138378 A1 | 6/2007 | Chang et al. |
| 2007/0177289 A1 | 8/2007 | Shim et al. |
| 2007/0188744 A1 | 8/2007 | Leslie et al. |
| 2007/0210395 A1 | 9/2007 | Maruyama et al. |
| 2007/0235829 A1 | 10/2007 | Levine et al. |
| 2007/0291810 A1 | 12/2007 | Luo et al. |
| 2008/0044932 A1 | 2/2008 | Samoilov et al. |
| 2008/0173903 A1 | 7/2008 | Imai et al. |

(56) References Cited

U.S. PATENT DOCUMENTS

| | | |
|---|---|---|
| 2008/0267241 A1 | 10/2008 | Brown et al. |
| 2008/0315092 A1 | 12/2008 | Kley |
| 2008/0315121 A1 | 12/2008 | Nihtianov et al. |
| 2009/0021717 A1 | 1/2009 | Nihtianov et al. |
| 2009/0045325 A1 | 2/2009 | Tomuta et al. |
| 2009/0091752 A1 | 4/2009 | Terasawa et al. |
| 2009/0108207 A1 | 4/2009 | Liu |
| 2009/0125242 A1 | 5/2009 | Choi et al. |
| 2009/0128912 A1 | 5/2009 | Okada et al. |
| 2009/0168152 A1 | 7/2009 | Gelernt et al. |
| 2009/0180176 A1 | 7/2009 | Armstrong et al. |
| 2009/0324234 A1 | 12/2009 | Kashima |
| 2010/0026865 A1 | 2/2010 | Tivarus et al. |
| 2010/0038540 A1 | 2/2010 | Hannebauer |
| 2010/0102213 A1 | 4/2010 | Garris |
| 2010/0103409 A1 | 4/2010 | Ohshima et al. |
| 2010/0140675 A1 | 6/2010 | Rhodes |
| 2010/0148667 A1 | 6/2010 | Niigaki et al. |
| 2010/0164042 A1 | 7/2010 | Manabe |
| 2010/0188655 A1 | 7/2010 | Brown et al. |
| 2010/0208979 A1 | 8/2010 | Abbott et al. |
| 2010/0233869 A1 | 9/2010 | Park et al. |
| 2010/0301437 A1 | 12/2010 | Brown et al. |
| 2011/0062499 A1 | 3/2011 | Burke |
| 2011/0073982 A1 | 3/2011 | Armstrong et al. |
| 2011/0101219 A1 | 5/2011 | Uchiyama et al. |
| 2011/0116077 A1 | 5/2011 | Chuang et al. |
| 2011/0168886 A1 | 7/2011 | Shadman et al. |
| 2011/0169116 A1 | 7/2011 | Nanver et al. |
| 2011/0234790 A1 | 9/2011 | True |
| 2011/0256655 A1 | 10/2011 | Nikzad et al. |
| 2011/0261354 A1 | 10/2011 | Sinfield et al. |
| 2011/0291109 A1 | 12/2011 | Wraback et al. |
| 2012/0007920 A1 | 1/2012 | Takahashi |
| 2012/0012811 A1 | 1/2012 | Deflumere et al. |
| 2012/0012957 A1 | 1/2012 | Larsen et al. |
| 2012/0081684 A1 | 4/2012 | Den et al. |
| 2012/0132823 A1 | 5/2012 | Menge et al. |
| 2012/0160993 A1 | 6/2012 | Nevet et al. |
| 2012/0170021 A1 | 7/2012 | Walsh |
| 2012/0217558 A1 | 8/2012 | Togashi |
| 2012/0228485 A1 | 9/2012 | Iwakiri et al. |
| 2012/0268722 A1 | 10/2012 | Nihtianov et al. |
| 2013/0009069 A1 | 1/2013 | Okada |
| 2013/0016346 A1 | 1/2013 | Romanovsky et al. |
| 2013/0017205 A1 | 1/2013 | Giaccia et al. |
| 2013/0020491 A1 | 1/2013 | Mazzillo |
| 2013/0056843 A1 | 3/2013 | Lee et al. |
| 2013/0077086 A1 | 3/2013 | Chuang et al. |
| 2013/0082241 A1 | 4/2013 | Kub et al. |
| 2013/0088706 A1 | 4/2013 | Chuang et al. |
| 2013/0126705 A1 | 5/2013 | Maleev |
| 2013/0149807 A1 | 6/2013 | Jangjian et al. |
| 2013/0169957 A1 | 7/2013 | Wolf et al. |
| 2013/0176552 A1 | 7/2013 | Brown et al. |
| 2013/0194445 A1 | 8/2013 | Brown et al. |
| 2013/0270663 A1 | 10/2013 | Lin et al. |
| 2013/0313440 A1 | 11/2013 | Chuang et al. |
| 2013/0320211 A1 | 12/2013 | Park et al. |
| 2013/0334638 A1 | 12/2013 | Chen et al. |
| 2013/0336574 A1 | 12/2013 | Nasser-Ghodsi et al. |
| 2013/0341504 A1 | 12/2013 | Neill et al. |
| 2014/0111799 A1 | 4/2014 | Lei et al. |
| 2014/0151552 A1 | 6/2014 | Jiang et al. |
| 2014/0203386 A1 | 7/2014 | Bui et al. |
| 2014/0204963 A1 | 7/2014 | Chuang et al. |
| 2014/0246595 A1 | 9/2014 | Menge et al. |
| 2014/0302630 A1 | 10/2014 | Tian et al. |
| 2014/0305367 A1 | 10/2014 | Chuang et al. |
| 2014/0362203 A1 | 12/2014 | Delaney et al. |
| 2015/0007765 A1 | 1/2015 | Dribinski |
| 2015/0177159 A1 | 6/2015 | Brown et al. |
| 2015/0275393 A1 | 10/2015 | Bondokov et al. |
| 2015/0294998 A1 | 10/2015 | Nihtianov et al. |
| 2017/0338257 A1* | 11/2017 | Muramatsu ........ H01L 27/14687 |
| 2018/0061872 A1 | 3/2018 | Ohtani et al. |
| 2018/0315747 A1* | 11/2018 | Agam ................. H01L 29/1083 |

FOREIGN PATENT DOCUMENTS

| | | |
|---|---|---|
| EP | 1939917 A2 | 7/2008 |
| EP | 2346094 A1 | 7/2011 |
| JP | H0511287 A | 1/1993 |
| JP | H08241977 A | 9/1996 |
| JP | H10171965 A | 6/1998 |
| JP | 2002033473 | 1/2002 |
| JP | 2003043533 A | 2/2003 |
| JP | 2004031452 A | 1/2004 |
| JP | 2007040909 A | 2/2007 |
| JP | 2007086108 A | 4/2007 |
| JP | 2007249092 A | 9/2007 |
| JP | 2007298932 A | 11/2007 |
| JP | 2009117454 A | 5/2009 |
| JP | 2010003755 A | 1/2010 |
| JP | 2011216623 A | 10/2011 |
| KR | 100688497 B1 | 3/2007 |
| KR | 100826407 B1 | 5/2008 |
| RU | 2297070 C2 | 4/2007 |
| WO | 9532518 A1 | 11/1995 |
| WO | 9617372 A1 | 6/1996 |
| WO | 2007035858 A2 | 3/2007 |
| WO | 2011091159 A1 | 7/2011 |
| WO | 2013006867 A1 | 1/2013 |
| WO | 2014067754 A2 | 5/2014 |

OTHER PUBLICATIONS

Allen et al., Work Function, Photoelectric Threshold, and Surface . . . ; Physical Review, vol. 127, No. 1, Jul. 1, 1962, pp. 150-158.

Armstrong, Carter M.The Quest for the Ultimate Vacuum Tube, Spectrum IEEE, Dec. 2015, 4 pgs.

Ding, MengField Emission from Silicon, MIT 2001, 277 pgs.

Fanton et al, Multiparameter Measurements of Thin Film . . . , Journal of Applied Physics, vol. 73, No. 11, p. 7035 (1993).

Field Emitter Review, 7 pgs in Japanese.

Fowler, R. H., et al, Electron Emission in Intense Electric Fields, Mar. 31, 1928, 9 pgs.

Fu et al., Optimizing GaN photocathode structure for higher . . . ; Optik, vol. 123, No. 9, May 2012, pp. 756-768.

Hecht, Optics, Fourth Edition, India: Pearson Education Pte, Ltd. 2004.

Hecht, Optics, Second Edition, Adelphi University, 1987, Addison-Wesley Publishing Company, Inc., 3 pages.

Henderson, Brian S., Study of Negative Electron Affinity . . . , Dept. of Physics, Rice Univ., Aug. 7, 2009, 18 pgs.

Howarth et al., Transmission silicon photoemitters . . . , Jrnl of Physics D: Applied Physics, vol. 9, No. 5, Apr. 1, 1976, pp. 785-794.

ISR and Written Opinion dated Mar. 31, 2014 for PCT/US2013/074124.

Janesick, James R., Scientific Charge-Coupled Devices, SPIE Press, 2001, pp. 556-561.

KLA-Tencor Coporation, filed application U.S. Appl. No. 62/059,368, filed Oct. 3, 2014 and entitled "183nm Laser and Inspection System".

Koike, AkifumiField Emitter Equipped With a Suppressor to Control Emission Angel, IEEE Electron Device Letters, vol. 34, No. 5, May 2013, 3 pgs.

Martinelli, Ramon U., Infrared Photoemission from Silicon, Applied Physics Letters, vol. 16, No. 7, Apr. 1, 1970, pp. 261-262.

Martinelli, Ramon U., Reflection and Transmission Secondary Emission . . . , Applied Physics Letters, vol. 17, No. 8, Oct. 15, 1970, pp. 313-314.

Nagao, Masayoshi, Cathode Technologies for Field Emission Displays, IEEJ Trans 2006; 1:171-178, 8 pgs.

Nagao, MasayoshiFabrication of a Field Emitter Array with a Built-In Einzel Lens, JJAP 48 (2008) 06FK02, 4 pgs.

Nanver et al., Pure-Boron Chemical-Vapor-Deposited Layers: a New Material for Silicon Device Processing, 18th IEEE Interna-

(56) References Cited

OTHER PUBLICATIONS tional Conference on Advanced Thermal Processing of Semiconductors (RTP), Sep. 28, 2010-Oct. 1, 2010, pp. 136-139.
Nanver, Silicon Photodiodes for Low Penetration Depth Beams such as DUV/VUV/EUV Light and Low-Energy Electrons, Advances in Photodiodes, G. Betta, ed., Mar. 22, 2011, pp. 205-224, www.intechopen.com.
Neo, YoichiroElectron Optical Properties of Microcolumn with Field Emitter, JJAP 52 (2013) 036603, 5 pgs.
Pain; et al., "Pain et al., "A Back-Illuminated Megapixel CMOS Image Sensor", Jun. 9, 2005, IEEE Workshop on Charge-Coupled Devices and Advanced Image Sensors, Karuizawa, Japan, 4 pgs."
Rakhshandehroo, M.R. et al, Fabrication of a self-aligned silicon field emission . . . , JVSTB, 16, 765 (1998); doi: 10.1116/1,589900, 6 pgs.
Rakhshandehroo, M.R. et al, Field emission from gated Si emitter tips with precise . . . , JVSTB, 15, 2777 (1997); doi: 10.1116/1.589726, 6 pgs.
Raoult, Efficient generation of narrow-bandwidth . . . , Jul. 15, 1998, vol. 23, No. 14, Optics Letters, pp. 1117-1119.
Sarubbi et al., Chemical Vapor Deposition of α-Boron Layers on Silicon for Controlled Nanometer-Deep p+ n Junction Formation, J. Electron. Mat., vol. 39, No. 2, Feb. 2010, pp. 162-173.
Sarubbi et al., Pure boron-doped photodiodes . . . IEEE, Sep. 15, 2008, pp. 278-281.
Sato, T., et al, Fabrication and characterization of HfC coated . . . , J. Vac. Sci. Technol. B 2194), published Jul. 31, 2003, 5 pgs.
Serbun Pavel et al, Stable field emission of single B-doped . . . , JVSTB, 31, 02B101 (2013); doi: 10.1116/1.4765088, 7 pgs.
Sobieski, Stanley, Intensified Charge Coupled Devices For Ultra Low Light Level Imaging, NASA, Goddard Space Flight Center, SPIE vol. 78 (1976) Low Light Level Devices, pp. 73-77.
Tobin, Kenneth W., Inspection in Semiconductor Manufacturing, Webster's Encyclopedia of Electrical and Electronic Engineering, vol. 10, pp. 242-262, Wiley & Sons, NY, NY, 1999.
Utsumi, Takao, Vacuum Microelectrnoics: What's New and Exciting, IEEE vol. 38, No. 10, Oct. 1991, 8 pgs.
Fu, Xiaogian, et al.,Higher Quantum Efficiency by Optimizing . . . 978-1-4244-6644-3/10 IEEE, pp. 234-235.
Omatsu, Takashige et al., High repetition rate Q-switching performance in transversely diode-pumped Nd doped mixed gadolinium . . . , Optics Express vol. 14, Issue 7, 9 pages, 2006 Optical Society of America.
Sakic, Agata et al., Boron-layer silicon photodiodes for high-efficiency . . . , Solid-State Electronics, 2011, 7 pages.
Dulinski, Wojciech et al., article entitled "Tests of a backside illuminated monolithic CMOS pixel sensor in an HPD set-up", Nuclear Instruments and Methods in Physics Research A 546 (2005) 274-280, 7 pgs.
Grubisic et al., New Silicon Reach-Through Avalanche Photodiodes with Enhanced Sensitivity in the DUV/UV Wavelength Range, MIPRO 2013, May 20-24, 2013, pp. 48-54.
Grunthaner, P. J et al., article entitled "Hydrogen-Terminated SiliconSubstrates for Low-Temperature Molecular Beam Epitaxy," Thin Solid Films, 183,pp. 197-212,May 30, 1989.

Hoenk, Michael E et al., article entitled "Growth of a delta-doped silicon layer by molecular beam epitaxy on a charge-coupled device for reflection-limited ultraviolet quantum efficiency," Appl. Phys. Lett. 61, pp. 1084-1086 plus cover page(1992).
Hoenk, Michael E et al., article entitled "Superlattice-doped detectors for UV through gamma-ray imaging and spectroscopy," International Image Sensors Workshop, Jun. 8-11, 2015, 4 pages.
Hoenk, Michael E et al., article entitled "The DUV Stability of Superlattice-dopedCMOS Detector Arrays," International Image SensorWorkshop Jun. 12-16, 2013, 4 pages.
Huang et al., Back-Side Illuminated Photogate CMOS . . . , IEEE Sensors Journal, vol. 11, No. 9, Sep. 2011, 5 pgs.
Itzler et al., InP-based Geiger-mode . . . , Proc. SPIE vol. 7320 (2000), 12 pgs.
Jorke, H., et al., article entitled "Boron delta doping in Si and Si0.8 Ge0.2 layers", Appl. Phys. Lett., 57 (17), pp. 1763-1765 (1990).
Liaw, H.M. and Rose, J.W., Chapter 1 Silicon Vapor-Phase Epitaxy, Section 1.3.1 entitled "Growth from Silane", pp. 20-22 inB.J. Baliga (ed.), "Epitaxial Silicon Technology," Academic Press, 1986.
Liehr, M et al., article entitled "Kinetics of silicon epitaxy using SiH4in a rapid thermal chemical vapor deposition Yeactor," Appl. Phys. Lett. 56(7), pp. 629-631 plus cover page (1990).
Lim, Seunghuyn, Low-Power Analog-to-Digital Converters for . . . ; Graduate School, Yonsei Univ. Dept. of EEE, Feb. 2010, pp. 16-21.
Mattey, N.L., et al. article entitled "p-type delta doped layers in silicon: Structural and Electronic Properties", Appl. Phys. Lett., 57 (16), pp. 1648-1650 (1990).
Meyerson, Bernard S., et al. article entitled "Bistable conditions for low-temperature silicon epitaxy", , Appl. Phys. Lett. 57 (10), pp. 1034-1036 (1990).
Mouchart et al., Thin Film Optical Coatings. 7: Two Layer Coatings Close To Antireflection, Applied Optics, vol. 18, No. 8, Apr. 15, 1979, pp. 1226-1232.
Nanver, Lis K., Silicon Photodiodes for Low Penetration Depth Beams such as DUV/VUV/EUV Light and Low-Energy Electrons, Delta Institute of Microsystems and Nanoelectornics (DIMES), (2011) 21 pgs.
Niclass et al., Design and Characterization of a CMOS 3-D . . . , IEEE Journal Solid-State Circuits, vol. 40, No. 9, Sep. 2005, 8 pgs.
Nikzad, Shouleh et al., article entitled "Delta-doped CCDs High QE with long-term stability at UV and visible wavelengths"; SPIE vol. 2198 (1994) pp. 907-915.
Paetzel et al., Activation of Silicon Wafer by Excimer Laser, 18th IEEE Conf. Advanced Thermal Processing of Semiconductors-RTP 2010, 5 pgs.
Stevanovic et al., A CMOS Image Sensor for High-Speed Imaging, 2000 IEEE int'l. Solid-State Circuits Conf., 3 pgs.
Vaillant, Joel et al., Int'l. Conf. on Space Optics, High performance UV antirelection coating for back thinned CCD and CMOS Image sensors, Oct. 4-8, 2010, 4 pgs.
Shiraki, Yasuhiro, article entitled "Silicon molecular beam epitaxy", Journal of Vacuum Science & Technology B Microelectronics Processing and Phenomena (1985) published by the American Institute of Physics, 5 pages.

* cited by examiner

BACK-ILLUMINATED SENSOR AND A METHOD OF MANUFACTURING A SENSOR

RELATED APPLICATIONS/PATENTS

This application claims priority from U.S. Provisional Patent Application No. 62/778,445, entitled "BACK-ILLUMINATED SENSOR AND A METHOD OF MANUFACTURING A SENSOR", which was filed on Dec. 12, 2018, and is incorporated by reference herein. This application also is related to U.S. Pat. Nos. 9,496,425, 9,818,887 and 10,121,914, all to Chern et al., and all entitled "Back-illuminated sensor with boron layer". These patents and applications are incorporated herein by reference.

FIELD OF THE DISCLOSURE

The present application relates to image sensors suitable for sensing radiation in deep UV (DUV) and vacuum UV (VUV) wavelengths, and to methods for making such image sensors. These sensors are suitable for use in photomask, reticle, or wafer inspection systems and for other applications.

RELATED ART

The following description and examples are not admitted to be prior art by virtue of their inclusion in this section.

The integrated circuit industry requires inspection tools with increasingly higher resolution to resolve ever smaller features of integrated circuits, photomasks, reticles, solar cells, charge coupled devices etc., as well as detect defects whose sizes are of the order of, or smaller than, those feature sizes.

Inspection systems operating at short wavelengths, e.g. wavelengths shorter than about 250 nm, can provide such resolution in many cases. In particular for photomask or reticle inspection, it is desirable to inspect using a wavelength identical, or close, to the wavelength that will be used for lithography, i.e. close to 193.4 nm for current generation lithography and close to 13.5 nm for future EUV lithography, as the phase-shifts of the inspection light caused by the patterns will be identical or very similar to those caused during lithography. For inspecting semiconductor patterned wafers, inspection systems operating over a relatively broad range of wavelengths, such as a wavelength range that includes wavelengths in the near UV, DUV, and/or VUV ranges, can be advantageous because a broad range of wavelengths can reduce the sensitivity to small changes in layer thicknesses or pattern dimensions that can cause large changes in reflectivity at an individual wavelength.

In order to detect small defects or particles on photomasks, reticles, and semiconductor wafers, high signal-to-noise ratios are required. High photon flux densities are required to ensure high signal-to-noise ratios when inspecting at high speed because statistical fluctuations in the numbers of photons detected (Poisson noise) is a fundamental limit on the signal-to-noise ratio. In many cases, approximately 100,000 or more photons per pixel are needed. Because inspection systems are typically in use 24 hours per day with only short stoppages, the sensors are exposed to large doses of radiation after only a few months of operation.

A photon with a vacuum wavelength of 250 nm has energy of approximately 5 eV. The bandgap of silicon dioxide is about 10 eV. Although it may appear such wavelength photons cannot be absorbed by silicon dioxide, silicon dioxide as grown on a silicon surface must have some dangling bonds at the interface with the silicon because the silicon dioxide structure cannot perfectly match that of the silicon crystal. In addition, because the single dioxide is amorphous, there will be dangling bonds within the material. In practice, there will be a non-negligible density of defects and impurities within the oxide, as well as at the interface to underlying semiconductor, that can absorb photons with DUV wavelengths, particularly those shorter than about 220 nm in wavelength. Furthermore, under high radiation flux density, two high-energy photons may arrive near the same location within a very short time interval (nanoseconds or picoseconds), which can lead to electrons being excited to the conduction band of the silicon dioxide by two absorption events in rapid succession or by two-photon absorption.

A further requirement for sensors used for inspection, metrology and related applications is high sensitivity. As explained above, high signal-to-noise ratios are required. If the sensor does not convert a large fraction of the incident photons into signal, then a higher intensity light source would be required in order to maintain the same inspection or measurement speed compared with an inspection or metrology system with a more efficient sensor. A higher intensity light source would expose the instruments optics and the sample being inspected or measured to higher light intensities, possibly causing damage or degradation over time. A higher intensity light source would also be more expensive or, particularly at DUV and VUV wavelengths, may not be available. Silicon reflects a high percentage of DUV and VUV light incident on it. For example, near 193 nm in wavelength, silicon with a 2 nm oxide layer on its surface (such as a native oxide layer) reflects approximately 65% of the light incident on it. Growing an oxide layer of about 21 nm on the silicon surface reduces the reflectivity to close to 40% for wavelengths near 193 nm. A detector with 40% reflectivity is significantly more efficient than one with 65% reflectivity, but lower reflectivity, and hence higher efficiency, is desirable.

Anti-reflection coatings are commonly used on optical elements such as lenses and mirrors. However, many coating materials and processes commonly used for optical elements are often not compatible with silicon-based sensors. For example, electron and ion-assisted deposition techniques are commonly used for optical coatings. Such coating processes cannot generally be used to coat semiconductor devices because the electrons or ions can deposit sufficient charge on the surface of the semiconductor device to cause electrical breakdown resulting in damage to the circuits fabricated on the semiconductor.

DUV and VUV wavelengths are strongly absorbed by silicon. Such wavelengths may be mostly absorbed within about 10 nm or a few tens of nm of the surface of the silicon. The efficiency of a sensor operating at DUV or VUV wavelengths depends on how large a fraction of the electrons created by the absorbed photons can be collected before the electrons recombine. Silicon dioxide can form a high-quality interface with silicon with a low density of defects. Most other materials including many of those commonly used for anti-reflection coatings, if deposited directly on silicon, result in a very high density of electrical defects at the surface of silicon. A high density of electrical defects on the surface of silicon may not be an issue for a sensor intended to operate at visible wavelengths, as such wavelengths may typically travel about 100 nm or more into the silicon before being absorbed and may, therefore, be little affected by electrical defects on the silicon surface. However, DUV and VUV wavelengths are absorbed so close to the silicon surface that electrical defects on the surface and/or trapped charged within the layer(s) on the surface can result in a significant fraction of the electrons created recombining at, or near, the silicon surface and being lost, resulting in a low efficiency sensor.

U.S. Pat. Nos. 9,496,425, 9,818,887 and 10,121,914, all to Chern et al., describe image sensor structures and methods of making image sensors that include a boron layer deposited on, at least, an exposed back surface of the image sensor. Different ranges of temperature for deposition of the boron are disclosed, including a range of about 400-450° C. and a range of about 700-800° C. The inventors have discovered that one advantage of a higher deposition temperature for the boron, such as a deposition temperature between about 600° C. and about 900° C., is that at such temperatures boron diffuses into the silicon providing a very thin, heavily p-type doped silicon layer on the light-sensitive back surface. This p-type doped silicon layer is important for ensuring a high quantum efficiency to DUV and VUV radiation because it creates a static electric field near the surface that accelerates electrons away from the surface into the silicon layer. The p-type silicon also increases the conductivity of the back surface of the silicon, which is important for high-speed operation of an image sensor, since a return path is needed for ground currents induced by the switching of signals on electrodes on the front surface of the sensor.

However, processing temperatures higher than 450° C. cannot be used on semiconductor wafers that include conventional CMOS circuits because 450° C. is close to the melting point metals such as aluminum and copper commonly used in fabricating CMOS devices. At high temperatures, such as those greater than 450° C., these metals expand, become soft and can delaminate. Furthermore, at high temperatures copper can easily diffuse through silicon which will modify the electrical properties of the CMOS circuits. Thinning a wafer before any metals are deposited on it allows a boron layer to be deposited on the back surface as described in the aforementioned patents at a temperature between 600 and 900° C. enabling boron to diffuse into the surface during, or subsequent to, the deposition of the boron layer. Subsequently metal interconnects can be formed on the front surface. After the image sensor regions of the wafer have been thinned, for example to a thickness of about 25 µm or thinner, the thinned region can be significantly warped and may have peak-to-valley non-flatness of many tens of microns or more. So, it is necessary to use relatively wide metal interconnect lines and vias, such as multiple microns wide or more, to ensure that the lines and vias connect in spite of any misalignment caused by the non-flatness. Such wide metal interconnects and vias increase the capacitance per unit area associated with those lines and vias. Furthermore, wide interconnects and vias can make it difficult, or impossible, to interconnect all the signals on a large area sensor with about one million or more pixels. In some cases, polysilicon jumpers may be needed to connect together metal interconnects, but polysilicon has much higher resistivity than any metal, so the use of such jumpers can limit the maximum operating speed of a sensor.

U.S. Pat. No. 5,376,810 to Hoenk et al. describes a delta-doping technique for image sensors that may be performed at a temperature of 450° C. or lower. This technique includes a 1.5 nm cap layer of nominally undoped silicon. This cap layer may be deliberately oxidized or may oxidize due to water and oxygen in the environment. This oxide layer will degrade under high intensity DUV, VUV, EUV or charged-particle radiation and can cause the sensor to degrade.

Therefore, a need arises for an image sensor capable of efficiently detecting high-energy photons without degrading yet overcoming some, or all, of the above disadvantages. In particular, a method of fabricating a back-thinned image sensor with a boron layer and boron doping on its back surface while allowing formation of metal interconnects on a relatively flat wafer (i.e. with a flatness of about 10 µm or less) would allow the use of finer design rules (such as the design rules corresponding to a 0.35 µm process or finer). Such a method would allow narrower metal lines connecting to critical features such as the floating diffusion, enabling smaller floating-diffusion capacitance and higher charge to voltage conversions ratios. Finer design rules also allow more interconnect lines per unit area of the sensor and allow more flexibility in connecting the circuits on the image sensor.

SUMMARY OF THE DISCLOSURE

Image sensors and methods of fabricating image sensors with high-quantum-efficiency for imaging DUV, VUV, EUV, X-rays and/or charged particles (such as electrons) are described. These image sensors are capable of long-life operation under high fluxes of radiation. These methods include process steps to form light sensitive active and/or passive circuit elements in a layer on a semiconductor (preferably silicon) wafer, as well as forming metal interconnections between the electrical elements of the sensor. These image sensors can include fine metal interconnects and vias (such as those conforming to about 0.35 µm, or finer, design rules), while having a backside surface coated with an amorphous boron layer and having a highly doped p-type silicon layer immediately adjacent to the boron layer. The metal interconnections may comprise tungsten, aluminum, copper or other metals used in fabricating interconnects in known CMOS processes.

An exemplary method of fabricating an image sensor includes forming a first epitaxial silicon layer on a substrate, forming a gate layer on the first epitaxial silicon layer, the gate layer comprising one or more layers of dielectric materials such as silicon dioxide and silicon nitride, forming circuit elements on the gate layer comprising poly-silicon and dielectric materials, forming metal vias and metal interconnects to connect together at least some of those circuit elements, thinning the substrate to expose at least a portion of the first epitaxial silicon layer (the exposed first epitaxial silicon layer is referred to herein as a semiconductor membrane), growing a second epitaxial silicon layer directly on the exposed portions of the first epitaxial layer, the second epitaxial silicon layer incorporating a concentration gradient of a p-type dopant such as boron, forming an amorphous pure boron layer directly on the surface of the second epitaxial silicon layer, and optionally forming one, or more, anti-reflection layers directly on the surface of the amorphous boron layer. As used herein, the phrase "circuit elements" refers to light sensitive devices such as charge-coupled devices and photodiodes, other semiconductor devices such as transistors, diodes, resistors and capacitors, and electrical interconnections (often called metal interconnects or interconnects) between them. These circuit elements are formed using standard semiconductor manufacturing processes including, but not limited to, photolithography, deposition, etching, ion implantation and annealing. The second epitaxial silicon layer may comprise an epitaxial silicon layer with a low concentration of the p-type dopant adjacent to the surface of the first epitaxial silicon layer and high concentration of the p-type dopant adjacent to the pure boron layer. The second epitaxial silicon layer may be formed by molecular-beam epitaxy (MBE). Thinning the substrate (e.g. a wafer) can be performed using reactive-ion etching, chemical etching and/or polishing. Notably, this thinning can increase the sensitivity of the image sensor to light impinging the back surface. An anti-reflection coating may be formed on the boron layer. Alternatively, a thin metal coating may be deposited on the boron layer. The thin metal coating may be particularly useful when the sensor is used to detect charged particles (such as electrons), EUV or X-rays. Such a thin metal coating may reduce to sensitivity of the sensor to stray light, may protect the surface of the sensor, and may facilitate in-situ cleaning of contaminants, such as carbon and organic molecules from the sensor surface.

Another method of fabricating an image sensor includes forming a first epitaxial silicon layer on a substrate, then forming circuit elements on the first epitaxial silicon layer. This step includes forming metal interconnects. The metal interconnects may comprise tungsten, molybdenum, aluminum, copper or another metal. A protective layer may be formed on the circuit elements. A handle wafer may be bonded to the surface that includes the circuit elements. The substrate is then thinned to expose, at least part of, the first epitaxial silicon layer. As indicated above, this thinning can increase the sensitivity of the image sensor to light impinging on the back surface. A second epitaxial silicon layer is grown on the exposed surface of the semiconductor membrane. The second epitaxial layer is doped with a p-type dopant such as a boron. The second epitaxial silicon layer may be grown at a temperature less than or about 450° C. The p-type dopant may be incorporated into the second epitaxial silicon layer during growth of that layer by including a dopant (such as boron) or a dopant precursor (such as diborane) in a growth chamber during a growth process. The partial pressure of the dopant or dopant precursor may be increased over time as the second epitaxial silicon layer grows thereby forming a dopant concentration profile within the second epitaxial silicon layer that is highest at the outer surface of the second epitaxial silicon layer and lowest at surface immediately adjacent to the first epitaxial silicon layer. A pure boron layer is formed on the surface of the p-type doped epitaxial silicon layer. The pure boron layer may be deposited at a temperature between about 300° C. and about 450° C. An anti-reflection coating may be formed on the boron layer. The anti-reflection coating may be formed by an atomic-layer deposition (ALD) or other process. Alternatively, a thin metal coating may be deposited on the boron layer. The thin metal coating may be particularly useful when the sensor is used to detect charged particles (such as electrons), EUV or X-rays. Such a thin metal coating may reduce to sensitivity of the sensor to stray light, may protect the surface of the sensor, and may facilitate in-situ cleaning of contaminants, such as carbon and organic molecules from the sensor surface.

Image sensors with high-quantum-efficiency and long-life operation for DUV, VUV, EUV and/or X-ray radiation are described. These image sensors are thinned from the back-side to expose at least a portion of a first epitaxial silicon layer so that they are highly sensitive to radiation impinging on the back-side of the image sensors (wherein these image sensors are back-illuminated). A second epitaxial silicon layer is grown directly on the exposed back surface of the first epitaxial silicon layer. The second epitaxial silicon layer is in-situ doped with a p-type dopant such that the concentration of the p-type dopant increases away from the surface of the first epitaxial layer. A thin (e.g. between about 2 nm and about 20 nm thick), high-purity, amorphous boron layer is deposited on the second epitaxial silicon layer. In some embodiments, one or more additional layers of material may be coated on the boron. The thickness and material of each layer may be chosen to increase the transmission of a wavelength of interest into the image sensor, and/or to protect the boron layer from damage.

The image sensors described herein may be fabricated using CCD (charge coupled device) or CMOS (complementary metal oxide semiconductor) technology. The image sensors may be two-dimensional area sensors, or one-dimensional array sensors.

DETAILED DESCRIPTION OF THE DRAWINGS

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The following description is presented to enable one of ordinary skill in the art to make and use the disclosure as provided in the context of a particular application and its requirements. As used herein, directional terms such as "top," "bottom,", "front," "back," "over," "under," "upper," "upward," "lower," "down," and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

Figure 1:
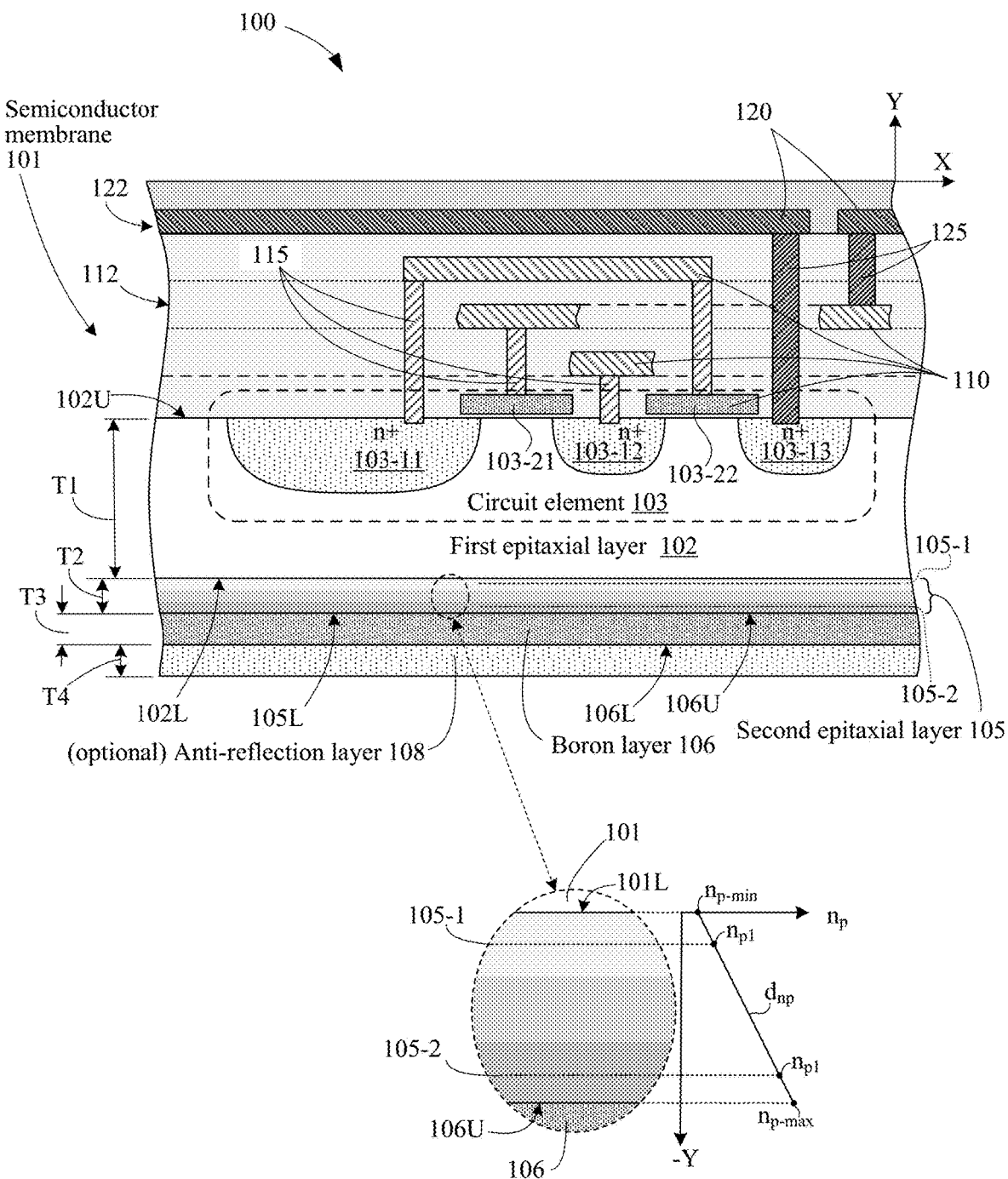
FIG. 1 is a cross-sectional view showing an exemplary image sensor produced in accordance with the present invention.

FIG. 1 is a cross-sectional side view depicting a portion of an image sensor 100 configured to sense deep ultraviolet (DUV) radiation, vacuum ultraviolet (VUV) radiation, extreme ultraviolet (EUV) radiation or charged particles according to an exemplary embodiment of the present invention. Image sensor 100 includes a semiconductor membrane 101 including a circuit element 103 formed on an upper (first) surface 102U of a first epitaxial layer and metal interconnects 110 and 120 formed over circuit element 103, a second epitaxial layer 105 disposed on a lower (second) surface 101L of first epitaxial layer 101, a pure boron layer 106 disposed on a lower surface 105L of second epitaxial layer 105, and an optional anti-reflection coating 108 disposed on a lower (outward-facing) surface 106L of pure boron layer 106.

In one embodiment, first epitaxial layer 101 comprises a layer of lightly p-doped epitaxial silicon having a thickness T1 in a range of 10 μm to 40 μm and a p-type (e.g., boron) dopant concentration in a range of about $10^{13}$ cm$^{-3}$ to $10^{14}$ cm$^{-3}$.

Circuit element 103 includes a sensor device (e.g., a light sensitive device such as a photodiode) and associated control transistors that are formed on (i.e., into and over) an upper (first) surface 101U of first epitaxial layer 101 using known techniques. In the depicted exemplary embodiment, circuit element 103 includes spaced-apart n+ doped diffusion regions 103-11, 103-12 and 103-12 that extend from upper surface 101U into corresponding portions of epitaxial layer 101, and polycrystalline silicon (polysilicon) gate structures 103-21 and 103-22 that are respectively separated from upper surface 101U by intervening gate oxide layers. First metal interconnects 110 and second metal interconnects 120, along with corresponding first metal vias 115 and second metal vias 125, are formed over circuit element 113 and are operably electrically connected to associated regions of circuit element 113 using known techniques. First metal interconnects 110 are formed in or on one or more dielectric layers 112 deposited over circuit element 113, and first metal vias 115 extend through dielectric layers 112 using known via formation techniques. Second metal interconnects 120 are formed in a second dielectric layer 122 that is disposed over first metal interconnects 110, and second metal vias 125 extend through one or both dielectric layers 112 and 122. In one embodiment, a protection layer (not shown in FIG. 1) is formed between first metal interconnects 110 and second metal interconnects 120, and all second metal vias 125 comprise at least one of aluminum and copper and extend through this protection layer. The exemplary diffusion regions and gate structures forming circuit element 103 depicted in FIG. 1, along with the exemplary metal interconnects 110 and 120 and metal vias 115 and 125, are arbitrarily configured for illustrative purposes and provided solely to for purposes of describing exemplary circuit element structures and is not intended to represent a functional sensor device or to limit the appended claims.

Second epitaxial layer 101 is disposed on lower surface 101L of first epitaxial layer 101 and has a thickness T2 in the range of 1 nm to 100 nm, and more preferably in the range of about 2 nm and about 20 nm.

Referring to the bubble located at the bottom of FIG. 1, according to an aspect of the present invention, second epitaxial layer 105 is formed using processing techniques described below such that second epitaxial layer 105 has a p-type dopant concentration gradient $d_{np}$ that systematically increases from a minimum (lowest) p-type doping concentration $n_p$-min at lower surface 102L to a maximum (highest) p-type doping concentration $n_p$-max at upper surface 106U. A benefit gained by simultaneously forming p-type dopant concentration gradient $d_{np}$ and second epitaxial layer 105 in this manner is the ability to create p-type dopant concentration gradient $d_{np}$ at substantially lower processing temperatures (i.e., about 450° C. or lower) than that required to form a similar p-type dopant concentration gradient within first epitaxial layer 101 (i.e., forming a similar gradient by diffusing a p-type dopant into first epitaxial layer 101 requires a processing temperature of at least 700° C., preferably about 800° C. or higher), thereby preserving thermal budget and reducing total manufacturing costs by way of facilitating the use of low-cost metallization materials (e.g., aluminum and copper). In addition, forming p-type dopant concentration gradient $d_{np}$ within second epitaxial layer 105 greatly enhances control over the rate at which the p-type dopant concentration changes within gradient $d_{np}$, which facilitates different gradient patterns (e.g., linear or parabolic) that may be used to further enhance the ability of image sensor (circuit element) 103 to efficiently detect high-energy photons. For example, the exemplary embodiment of FIG. 1 depicts the systematic increase of p-type dopant concentration gradient $d_{np}$ as a continuous linear increase as a function of the negative-Y-axis direction. In other embodiments the gradual increase of p-type dopant concentration gradient $d_{np}$ may be defined by any function of the thickness (negative-Y-axis) direction, such as a continuously curved increase (e.g., the change in doping concentration as a function of layer thickness follows a parabolic curve) or a discontinuous (step-wise) increase by way of varying the introduction of P-type dopant material during the second epitaxial layer formation process. In any case, first-to-be-formed layer portions (i.e., incremental layer portions generated during a given time period that occurs relatively early in the second epitaxial layer formation process) have a lower p-type doping concentration than at least one subsequently formed layer portion. For example, a p-type dopant concentration $n_{p1}$ of a (first) intermediate layer portion 105-1 of second epitaxial layer 105 is equal to or lower than a p-type dopant concentration $n_{p2}$ of a (second) intermediate layer portion 105-1 of second epitaxial layer 105. When p-type dopant concentration gradient $d_{np}$ varies in a continuously increasing manner relative to thickness (e.g., consistent with the linear function depicted in the example shown in FIG. 1, or based on a parabolically increasing rate), p-type dopant concentration $n_{p1}$ of intermediate layer portion 105-1 is higher (greater) than minimum p-type doping concentration $n_{p\text{-}min}$ and p-type dopant concentration $n_{p2}$ of intermediate layer portion 105-2 is lower (less) than maximum p-type doping concentration $n_{p\text{-}max}$. However, when p-type dopant concentration gradient $d_{np}$ varies in a step-wise increasing manner, a particular p-type dopant concentration may remain the same for thickness-wise regions of second epitaxial layer 105 (e.g., p-type dopant concentration $n_{p1}$ of intermediate layer portion 105-1 may be equal to minimum p-type doping concentration $n_{p\text{-}min}$). In an exemplary embodiment, maximum p-type doping concentration $n_{p\text{-}max}$ is approximately $10^{20}$ cm$^{-3}$, and minimum p-type doping concentration $n_{p\text{-}min}$ is greater than or approximately equal to a dopant concentration of first epitaxial layer 101.

In one embodiment, pure boron layer 106 is formed using techniques described below such that pure boron layer 106 has a thickness T3 in the range of 2 nm and 10 nm. In one embodiment, pure boron layer 106 comprises a boron concentration of 80% or higher, with inter-diffused silicon atoms and oxygen atoms predominantly making up the remaining 20% or less.

In one specific embodiment, thickness T3 of pure boron layer 106 is in the range of 3 nm to 10 nm, and optional anti-reflection coating 108 comprises a silicon dioxide layer deposited on a lower (outward-facing) surface 106L of pure boron layer 106.

Figure 2:
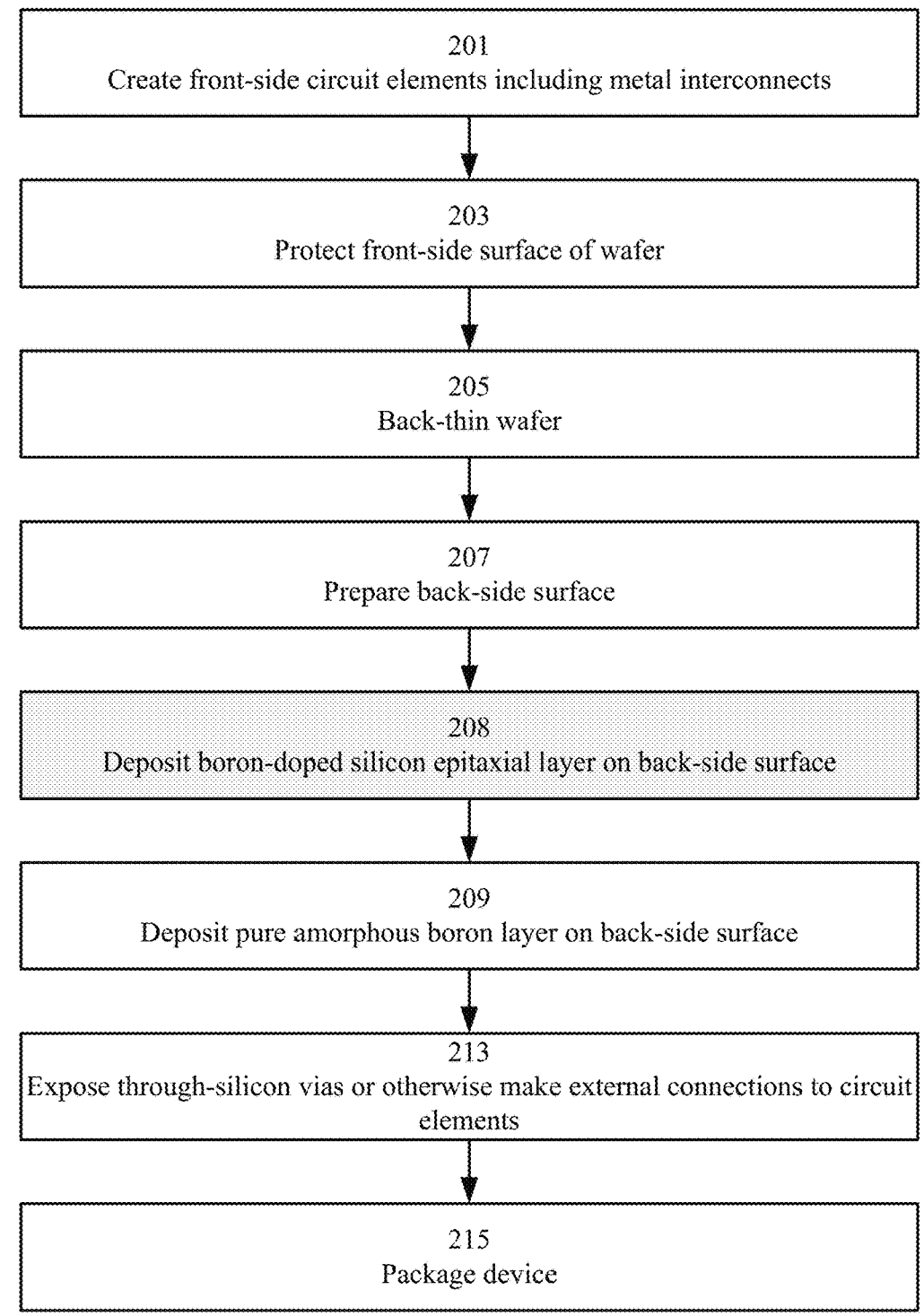
FIG. 2 illustrates an exemplary technique for fabricating an image sensor.

FIG. 2 illustrates an exemplary technique 200 for fabricating an image sensor. In this embodiment, the circuit elements can be created in step 201 using standard semiconductor processing steps including lithography, deposition, ion implantation, annealing, and etching. In one embodiment, CCD and/or CMOS sensor elements and devices may also be created in step 201. These circuit elements are created in a first epitaxial (epi) layer on the front-side surface of the wafer. In preferred embodiments, the first epitaxial layer is about 10 µm to 40 µm thick. The first epitaxial layer is lightly p (p−) doped. In one embodiment, the first epitaxial layer resistivity is between about 10 and 100 Ωcm. Metal interconnects are created in step 201 using any suitable metal including aluminum, copper, tungsten, molybdenum or cobalt. The use of refractory metals, such as tungsten or molybdenum to form first metal interconnects and associated metal vias may allow high temperatures (such as temperatures greater than about 600° C.) in subsequent steps, in particular in steps 209 and/or 211. However, when the temperatures in subsequent steps are limited to about 450° C. or lower, any convenient metal, including copper and aluminum may be used to form second metal interconnects and associated metal vias.

In step 203, the front-side surface of the wafer can be protected. This protection may include depositing one or more protective layers on top of the circuit elements formed during step 201. The one or more protective layers may comprise silicon dioxide, silicon nitride or other material. This protection may include attaching the wafer to a handling wafer, such as a silicon wafer, a quartz wafer, or a wafer made of other material. The handling wafer may include through-wafer vias for connecting to the circuit elements.

Step 205 involves thinning the wafer from the back-side so as to expose the first epitaxial layer in, at least, the active sensor areas. This step may involve polishing, etching, or both. In some embodiments, the entire wafer is back-thinned. In other embodiments, only the active sensor areas are thinned all the way to the first epitaxial layer.

Step 207 includes cleaning and preparing the back-side surface prior to deposition of a second epitaxial layer. During this cleaning, the native oxide and any contaminants, including organics and metals, should be removed from the back-side surface. In one embodiment, this cleaning can be performed using a dilute HF solution or using an RCA clean process. After cleaning, the wafer can be dried using the Marangoni drying technique or a similar technique to leave the surface dry and free of water marks.

In preferred embodiments, the wafer is protected in a controlled environment between steps 207 and 208 (e.g. in a vacuum environment or in an environment purged with a dry, inert gas such as nitrogen) to minimize native oxide regrowth after the cleaning.

Figure 3A:
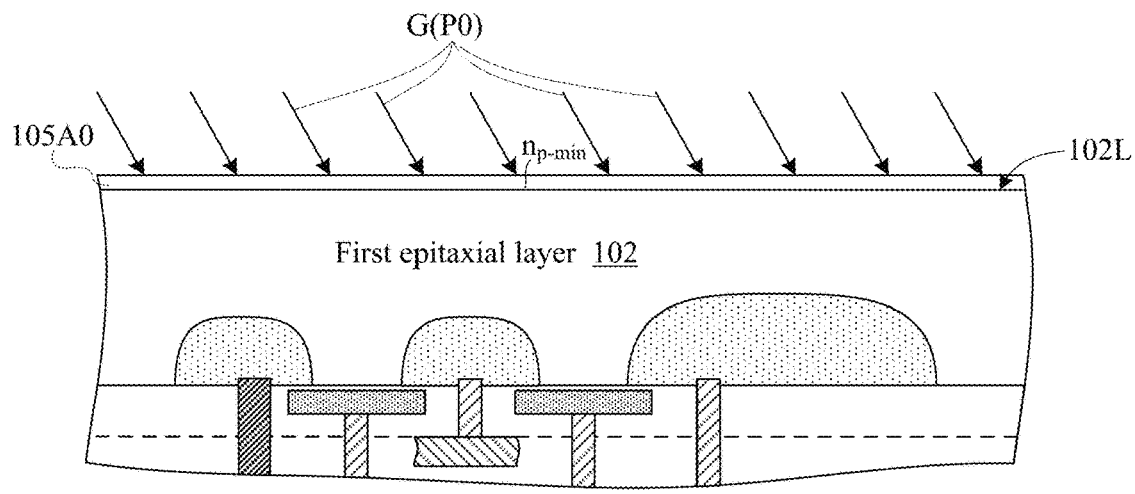
FIGS. 3A, 3B and 3C illustrate an exemplary method for fabricating an image sensor.
Figure 3B:
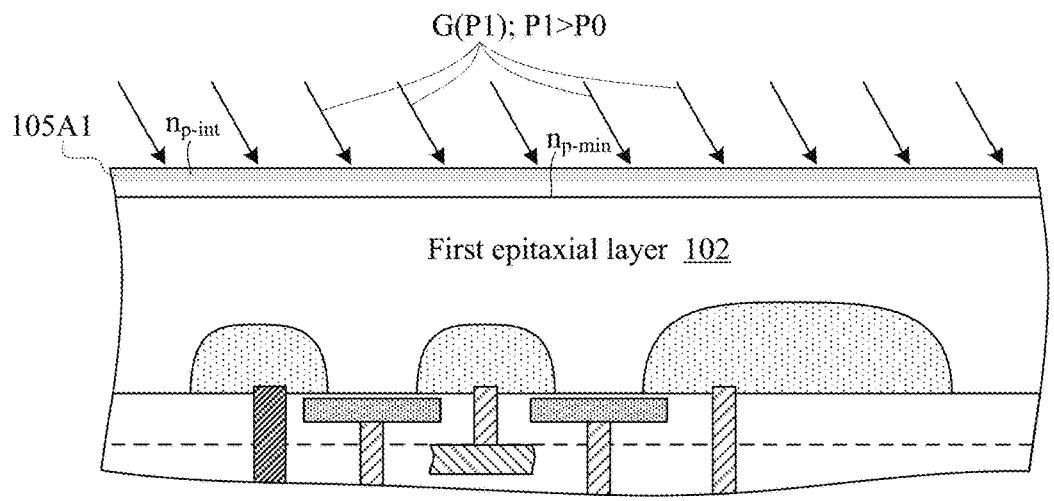
Figure 3C:
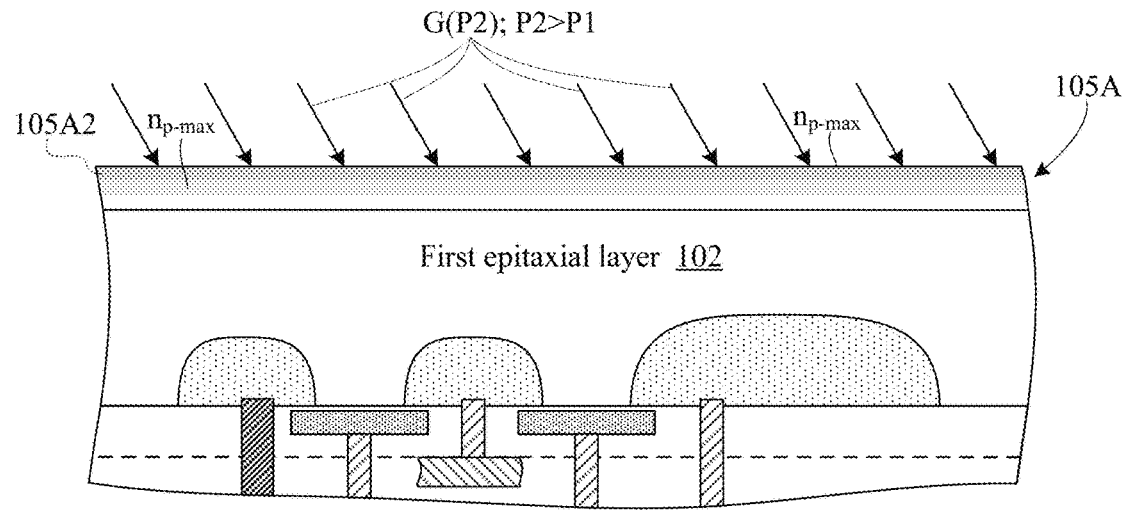

In step 208, a second epitaxial silicon layer is grown (deposited) on, at least, the exposed portion of the first epitaxial layer. In one embodiment the second epitaxial layer is grown by molecular-beam epitaxy (MBE) or other process at a temperature of about 350° C. or lower. In another embodiment, the second epitaxial layer is grown by a chemical vapor deposition (CVD) or plasma-enhanced CVD (PECVD) process at a temperature of about 450° C. or lower. As depicted in FIGS. 3A to 3C, second epitaxial layer 105A may be grown in a reaction chamber using a gas G containing both silicon and a p-type dopant such as boron, so as to create a p-doped epitaxial silicon layer. Referring to FIG. 3A, early in the deposition process gas G includes a relatively low amount P0 of p-type dopant, whereby a first layer portion 105A0 is formed such that a minimum p-type dopant concentration $n_{p\text{-}min}$ is generated adjacent to surface 102L of first epi layer 102. As the deposition progresses, the amount (concentration) of the p-type dopant in gas G is increased according to a selected schedule while maintaining the same amount of silicon such that the p-type dopant concentration in the second epitaxial layer portions disposed further from the first epitaxial layer is increased. For example, as indicated in FIG. 3B, during an intermediate stage of the epitaxial deposition process the deposition process gas G includes an intermediate amount P1 of p-type dopant that is greater than amount P0 used at the point indicated in FIG. 3A, whereby an intermediate layer portion 105A1 is formed with an intermediate p-type dopant concentration $n_{p\text{-}int}$ that is greater than minimum p-type dopant concentration $n_{p\text{-}min}$. Similarly, as indicated in FIG. 3C, during a final stage of the epitaxial deposition process the deposition process gas G includes a final amount P2 of p-type dopant that is greater than intermediate amount P1, whereby a final layer portion 105A2 is formed with maximum p-type dopant concentration $n_{p\text{-}max}$ that is greater than intermediate p-type dopant concentration $n_{p\text{-}int}$. In alternative embodiments, gas G used to grow the second epitaxial layer may include silicon or boron in elemental form, or may include precursors such as silane for silicon or diborane for boron.

In step 209, boron is deposited on the surface of the second epitaxial layer. In one preferred embodiment, this deposition can be done using diborane, or a diborane-hydrogen mixture, diluted in nitrogen at a temperature between about 300° C. and about 450° C., thereby creating a high-purity amorphous boron layer. In an alternative embodiment, the deposition may be done at a temperature lower than about 350° C., for example, by using a gas containing elemental boron. The thickness of the deposited boron layer depends on the intended application for the sensor. Typically, the boron layer thickness will be between about 2 nm and 20 nm, preferably between about 3 nm and 10 nm. The minimum thickness is set by the need for a pinhole-free uniform film, whereas the maximum thickness depends on the absorption of the photons or charged particles of interest by the boron, as well as the maximum length of time that the wafer can be kept at the deposition temperature.

More details on depositing boron from diborane gas can be found in "Chemical vapor deposition of a-boron layers on silicon for controlled nanometer-deep $p^+$-n junction formation," Sarubbi et al., J. Electron. Material, vol. 39, pp. 162-173, 2010, which is incorporated by reference herein.

After step 209, other layers may be deposited on top of the boron layer. These other layers may include anti-reflection coatings comprised of one or more materials, such as silicon dioxide, silicon nitride, aluminum oxide, hafnium dioxide, magnesium fluoride, and lithium fluoride. These other layers may include a thin protective layer comprising a metal such as aluminum, ruthenium, tungsten or molybdenum. One or more of these other layers may be deposited using ALD. An advantage of using an ALD process for depositing these layers is that ALD processes typically allow very precise (single monolayer) control of the thickness of the deposited layer(s). In an alternative embodiment, other layers may be deposited on top of the boron layer after step 213.

In one embodiment, the protective front-side layer may be removed in step 213. In another embodiment, in step 213, holes or vias can be opened or exposed in the handling wafer and/or protective front-side layer, or through-silicon vias around the edges of the device can be exposed, thereby allowing connection to the circuit elements.

In step 215, the resulting structure may be packed in a suitable package. The packing step may comprise flip-chip bonding or wire bonding of the device to a substrate. The package may include a window that transmits wavelengths of interest, or may comprise a flange or seal for interface to a vacuum seal.

Figure 4A:
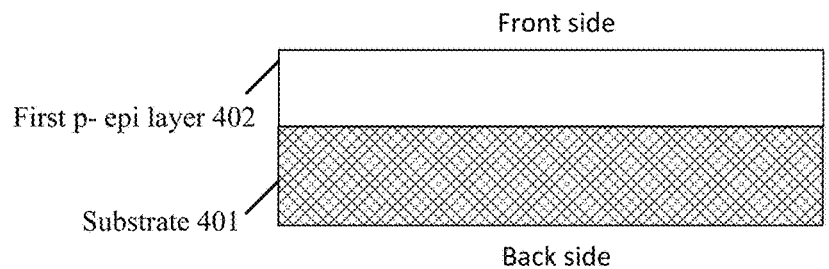
FIGS. 4A, 4B, 4C, 4D, 4E, 4F, 4G and 4H illustrate exemplary cross-sections of a portion of a wafer subjected to the method described in reference to FIG. 2.

FIGS. 4A-4G illustrate exemplary cross-sections of a wafer subjected to method 200 (FIG. 2). FIG. 4A illustrates a first epitaxial (epi) layer 402 formed on the front side of a substrate 401. First epi layer 402 is preferably a p– epi layer. In one embodiment, the first epi layer resistivity is between about 100 and 1000 Ωcm.

Figure 4B:
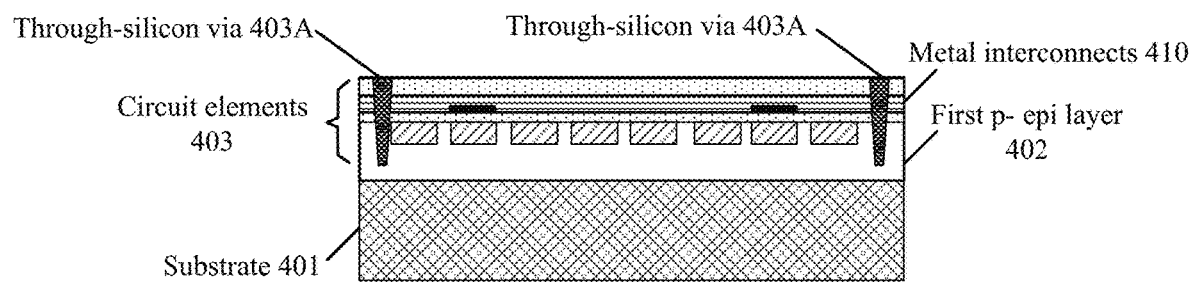

FIG. 4B illustrates various circuit elements 403 including interconnects that can be formed on the first epi layer 402 as described in step 201 above). Because the interconnects are formed on the wafer while the substrate is still hundreds of microns thick and hence not severely warped, these interconnects can be formed using normal sub-micron CMOS processing techniques and may include multiple layers of high-density metal interconnects. The metal interconnects comprise a metal such as copper, aluminum, tungsten, molybdenum or cobalt. In one embodiment, the metal interconnects consist entirely of refractory metals. In one embodiment, multiple through-silicon vias (TSV) 403A are created around one, or more, edges of the image sensor array in order to allow connection to the circuit elements 403.

Figure 4C:
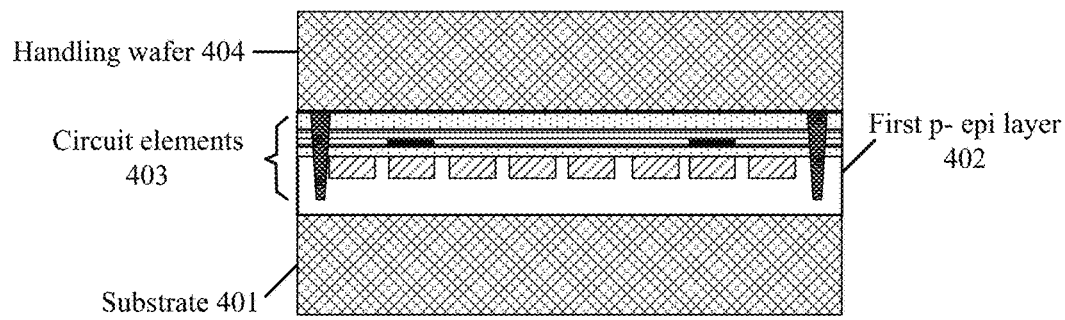

FIG. 4C illustrates a handling wafer 404 attached to the top surface of first epi layer 402 over circuit elements 403 (step 203). Note that the through-silicon vias are shown but not labeled so as not to overly complicate the drawings. In an alternative embodiment, a protective layer can be used instead of, or in addition to, handling wafer 404. In one embodiment (not shown), vias are formed in handling wafer 404 to allow connection to the circuit elements 403.

Figure 4D:
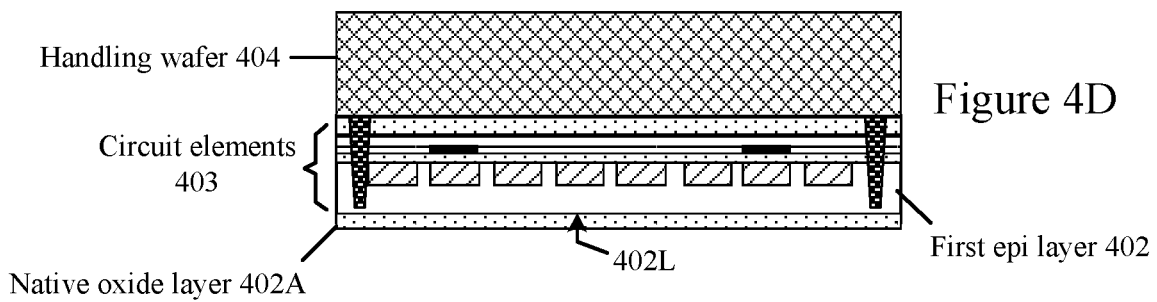

FIG. 4D illustrates the wafer after the substrate (e.g., substrate 401 shown in FIG. 4C) is back-thinned to form the semiconductor membrane mentioned above or removed to expose a back-side (lower) surface 402L of first epi layer 402 (i.e., opposite to the surface on which circuit elements 403 are formed and to which handling wafer 404 is attached). As depicted in FIG. 4D, a native oxide may form on back-side surface 402L, which is exposed by the back-thinning process.

Figure 4E:
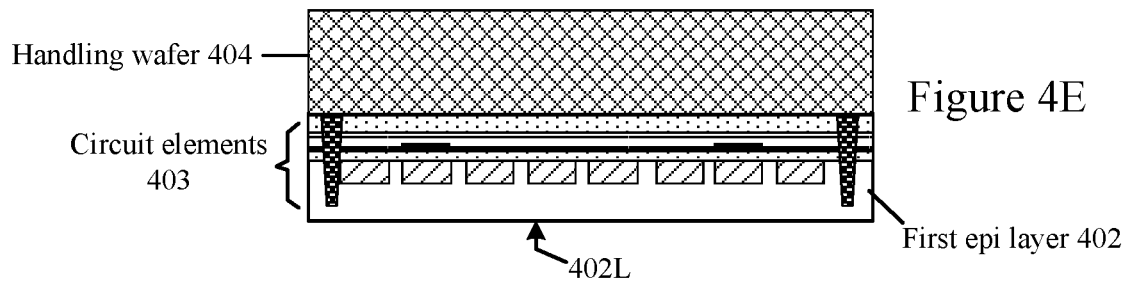

FIG. 4E illustrates the wafer after a cleaning and preparation of the back-side surface 402L is completed (step 207) to prepare first epi layer 402 for the formation of a second epitaxial (epi) layer.

Figure 4F:
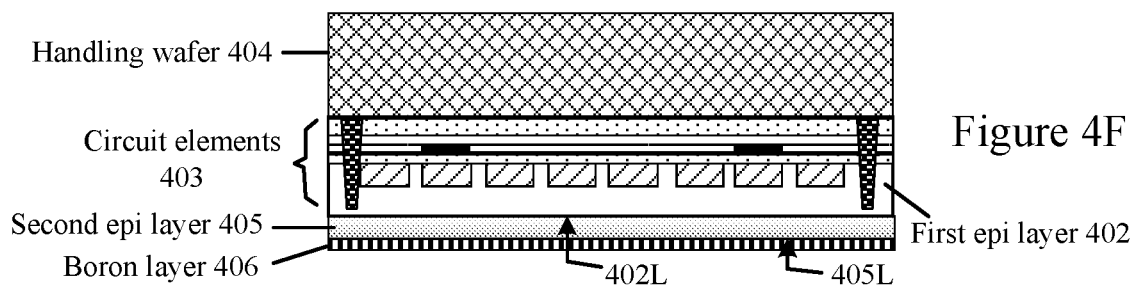

FIG. 4F illustrates the wafer after a second epi layer 405 is formed on back-side surface 402L of first epi layer 402, and a pure boron layer 406 is formed on a lower surface 405L of second epi layer 405 are respectively (steps 208 and 209). In-situ p-type doping of the second epi layer 405 during growth (as described above for step 208) creates a dopant concentration profile that increases from the bottom (back-side) surface 402L of first epi layer 402 to lower surface 405L of pure boron layer 406.

Figure 4G:
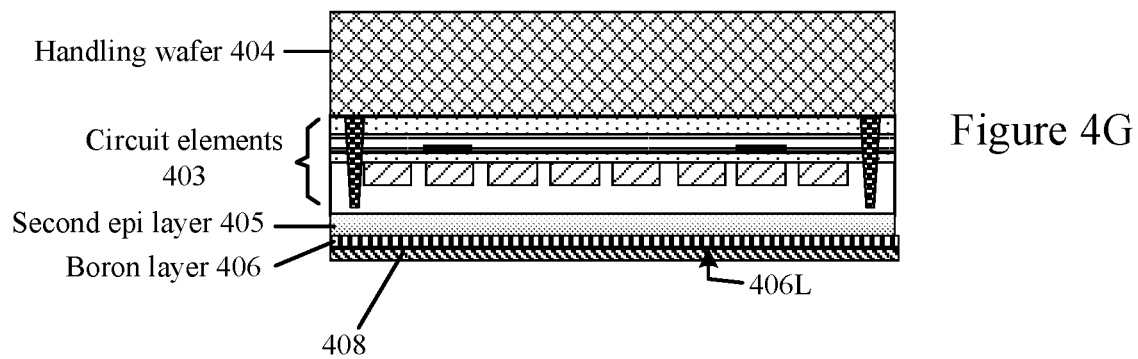

FIG. 4G illustrates one or more optional anti-reflection or metal protective layers 408 deposited bottom/lower surface 406L of pure boron layer 406. At least one of the layers may be deposited using an ALD process.

Figure 4H:
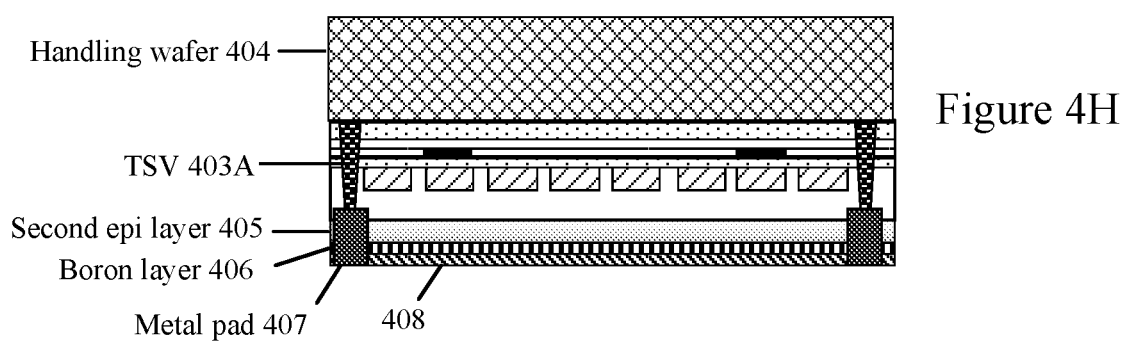

FIG. 4H illustrates the wafer after etching and deposition steps create metal pads 407 so as to allow electrical connection to the TSVs 403A (step 213). Note that if vias are formed in handling wafer 404, then metal pad 407 should be formed on the top surface of handling wafer 404.

The above examples are not meant to limit the scope of the invention disclosed herein. They are meant merely as illustrations of how a p-type doped second epitaxial layer may be deposited on a back-side surface of a first epitaxial layer. The second epitaxial layer is subsequently coated with a boron layer on its photo-sensitive surface. Because the second epitaxial layer includes a concentration gradient of the p-type dopant which has its maximum value adjacent to the boron, the image sensor has high efficiency even for short-wavelength light, or low-energy charged particles, which may penetrate only a few nm, or a few tens of nm into the epitaxial layers.

Figure 5:
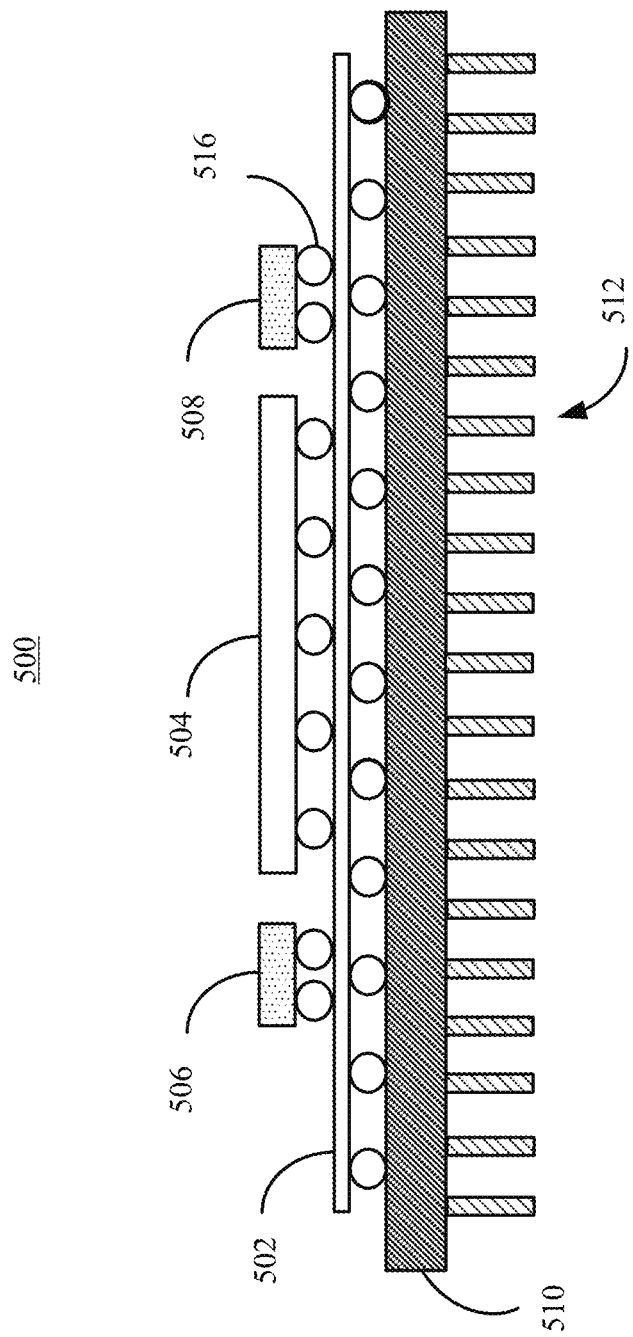
FIG. 5 illustrates an exemplary detector assembly incorporating an image sensor, a silicon interposer, and other electronics.

FIG. 5 illustrates an exemplary detector assembly 500 incorporating an image sensor 504, a silicon interposer 502 and other electronics in accordance with certain embodiments of the present invention.

In one aspect of the present invention, the detector assembly 500 may include one or more light sensitive sensors 504 disposed on the surface of an interposer 502. In one embodiment, the one or more interposers 502 of the assembly 500 may include, but are not limited to, a silicon interposer. In a further aspect of the present invention, the one or more light sensitive sensors 504 of the assembly 500 are back-thinned and further configured for back-illumination including a boron layer and a p-type doped second epitaxial layer adjacent to the boron layer as described above.

In another aspect of the present invention, various circuit elements of the assembly 500 may be disposed on or built into the interposer 502. In one embodiment, one or more amplification circuits (e.g., charge conversion amplifier) (not shown) may be disposed on or built into the interposer 502. In another embodiment, one or more conversion circuits 508 (e.g., analog-to-digital conversion circuits, i.e. digitizers 508) may be disposed on or built into the interposer 502. In another embodiment, one or more driver circuits 506 may be disposed on or built into the interposer 502. For example, the one or more driver circuits 506 may include a timing/serial drive circuit. For instance, the one or more driver circuits 506 may include, but are not limited to, clock driver circuitry or reset driver circuitry. In another embodiment, one or more decoupling capacitors (not shown) may be disposed on or built into the interposer 502. In a further embodiment, one or more serial transmitters (not shown in FIG. 5) maybe disposed on or built into the interposer 502. In another embodiment, one or more of amplification circuits, analog-to-digital converter circuits and driver circuits may be included in light sensitive sensor 504, reducing the number of (or eliminating the need for) circuits such as 506 and 508.

In another aspect of the present invention, one or more support structures may be disposed between the bottom surface of the light sensitive array sensor 504 and the top surface of the interposer 502 in order to provide physical support to the sensor 504. In one embodiment, a plurality of solder balls 516 may be disposed between the bottom surface of the light sensitive array sensor 504 and the top surface of the interposer 502 in order to provide physical support to the sensor 504. It is recognized herein that while the imaging region of the sensor 504 might not include external electrical connections, the back-thinning of the sensor 504 causes the sensor 504 to become increasingly flexible. As such, solder balls 516 may be utilized to connect the sensor 504 to the interposer 502 in a manner that reinforces the imaging portion of the sensor 504. In an alternative embodiment, an underfill material may be disposed between the bottom surface of the light sensitive array sensor 504 and the top surface of the interposer 502 in order to provide physical support to the sensor 504. For example, an epoxy resin may be disposed between the bottom surface of the light sensitive array sensor 504 and the top surface of the interposer 502.

In another aspect of the present invention, the interposer 502 and the various additional circuitry (e.g., amplification circuit, driver circuits 506, digitizer circuits 508, and the like) are disposed on a surface of a substrate 510. In a further aspect, the substrate 510 includes a substrate having high thermal conductivity (e.g., ceramic substrate). In this regard, the substrate 510 is configured to provide physical support to the sensor 504/interposer 502 assembly, while also providing a means for the assembly 500 to efficiently conduct heat away from the imaging sensor 504 and the various other circuitry (e.g., digitizer 506, driver circuitry 508, amplifier, and the like). It is recognized herein that the substrate may include any rigid highly heat conductive substrate material known in the art. For example, the substrate 510 may include, but is not limited to, a ceramic substrate. For instance, the substrate 510 may include, but is not limited to, aluminum nitride.

In another embodiment, the substrate 510 may be configured to provide an interface to a socket or an underlying printed circuit board (PCB). For example, as shown in FIG. 5, the substrate 510 may provide interconnection between the interposer 502 and a socket or a PCB via interconnects 512. Those skilled in the art will recognize that the substrate 510 may be operatively coupled to an underlying PCB and further electrically coupled to a socket or PCB in a variety of ways, all of which are interpreted to be within the scope of the present invention.

The various embodiments of the structures and methods of this invention that are described above are illustrative only of the principles of this invention and are not intended to limit the scope of the invention to the particular embodiments described. For example, additional steps may be added to the flow chart depicted in FIG. 2, or some of the steps shown may be done in different sequence than shown. Thus, the invention is limited only by the following claims and their equivalents.

The invention claimed is:

1. A method of fabricating an image sensor, the method comprising:
    forming a first epitaxial layer on a substrate;
    forming a circuit element on a first surface of the first epitaxial layer;
    thinning the substrate to generate a thinned substrate, the thinned substrate exposing at least a surface portion of a second surface of the first epitaxial layer, said second surface being opposed to the first surface on which said circuit element is disposed;
    forming a second epitaxial layer on the exposed portion of the first epitaxial layer; and
    forming a pure boron layer on the second epitaxial layer, wherein forming the second epitaxial layer includes generating a p-type dopant concentration gradient in the second epitaxial layer by gradually increasing a concentration of a p-type dopant used during formation of the second epitaxial layer such that a first layer portion of the second epitaxial layer has a lower p-type dopant concentration than a subsequently formed second layer portion of the second epitaxial layer, and a highest p-type dopant concentration of the second epitaxial layer is adjacent to the pure boron layer.

2. The method of claim 1, wherein the p-type dopant comprises boron.

3. The method of claim 1, wherein forming the second epitaxial layer comprises utilizing a gas containing elemental boron at a temperature lower than about 350° C.

4. The method of claim 3, wherein forming the second epitaxial layer comprises growing said second epitaxial layer using molecular-beam epitaxial growth.

5. The method of claim 1, wherein the method further comprises depositing an anti-reflection layer on a surface of the pure boron layer.

6. The method of claim 1, wherein the method further comprises depositing a metal protective layer on the surface of the pure boron layer.

7. The method of claim 1, wherein the method further comprises attaching a handling wafer to the first epitaxial layer over the circuit elements prior to thinning the substrate.

8. The method of claim 1, wherein forming the second epitaxial layer comprises utilizing a plasma-enhanced chemical vapor deposition process at a temperature lower than about 450° C.

9. A method of fabricating an image sensor, the method comprising:
    forming a first epitaxial layer on a substrate;
    forming a circuit element on said first epitaxial layer;
    thinning the substrate to generate a thinned substrate, the thinned substrate exposing at least a surface portion of the first epitaxial layer;
    forming a second epitaxial layer on the exposed portion of the first epitaxial layer; and
    forming a pure boron layer on the second epitaxial layer, wherein forming the second epitaxial layer includes generating a p-type dopant concentration gradient in the second epitaxial layer by gradually increasing a concentration of a p-type dopant used during formation of the second epitaxial layer such that a first layer portion of the second epitaxial layer has a lower p-type dopant concentration than a subsequently formed second layer portion of the second epitaxial layer, and a highest p-type dopant concentration of the second epitaxial layer is adjacent to the pure boron layer, and
    wherein the method further comprises:
    attaching a handling wafer to the first epitaxial layer over the circuit elements prior to thinning the substrate, and
    forming vias in at least one of the first epitaxial layer and the handling wafer prior to thinning the substrate.

10. The method of claim 9, wherein the method further comprises exposing the vias after forming the pure boron layer.

11. The method of claim 9, wherein the p-type dopant comprises boron.

12. The method of claim 9, wherein forming the second epitaxial layer comprises utilizing a gas containing elemental boron at a temperature lower than about 350° C.

13. The method of claim 12, wherein forming the second epitaxial layer comprises growing said second epitaxial layer using molecular-beam epitaxial growth.

14. The method of claim 9, wherein the method further comprises depositing an anti-reflection layer on a surface of the pure boron layer.

15. The method of claim 9, wherein the method further comprises depositing a metal protective layer on the surface of the pure boron layer.

16. The method of claim 9, wherein forming the second epitaxial layer comprises utilizing a plasma-enhanced chemical vapor deposition process at a temperature lower than about 450° C.

* * * * *